United States Patent [19]
Rivoire

[11] Patent Number: 5,431,964
[45] Date of Patent: Jul. 11, 1995

[54] METHOD OF PRETREATING THE DEPOSITION CHAMBER AND/OR THE SUBSTRATE FOR THE SELECTIVE DEPOSITION OF TUNGSTEN

[75] Inventor: Maurice Rivoire, Meylan, France

[73] Assignee: France Telecom (Etablissement Public National), Paris, France

[21] Appl. No.: 111,894

[22] Filed: Aug. 26, 1993

[30] Foreign Application Priority Data

Sep. 4, 1992 [FR] France .................. 92 10573

[51] Int. Cl.$^6$ .................. B05D 3/06; C23C 16/00
[52] U.S. Cl. .................. 427/535; 427/569; 427/576; 427/250; 427/253
[58] Field of Search ............ 427/533, 534, 535, 576, 427/569, 564, 562, 253, 255.1, 250

[56] References Cited

U.S. PATENT DOCUMENTS

| | | | |
|---|---|---|---|
| 4,613,400 | 9/1986 | Tam et al. | 427/579 |
| 4,816,294 | 3/1989 | Tsuo et al. | 427/582 |
| 4,969,415 | 11/1990 | Bartha et al. | 427/576 |
| 4,980,197 | 12/1990 | Suhr et al. | 427/576 |
| 5,108,543 | 4/1992 | Suzuki et al. | 427/534 |
| 5,207,836 | 5/1993 | Chang | 134/1 |

FOREIGN PATENT DOCUMENTS 0430303  6/1991  European Pat. Off. .

OTHER PUBLICATIONS

Proc. 6th International IEEE VLSI Multilevel Interconnection Conference, Jun. 12, 1989, Santa Clara, USA, pp. 151–157, Osamu Yamazaki, et al., "Selective CVD Tungsten Contact Plug Technology with Plasma Pre-Treatment".

*Primary Examiner*—Marianne Padgett
*Attorney, Agent, or Firm*—Oblon, Spivak, McClelland, Maier, & Neustadt

[57] ABSTRACT

The invention relates to the method of pretreating a deposition chamber intended to be used for the selective vapor deposition of tungsten, characterized in that a plasma of fluorine-containing gas, optionally combined with an inert diluting gas, is induced in the said deposition chamber.

Advantageously, the same fluorine treatment is applied to the substrate intended to receive the selective tungsten deposition.

8 Claims, 4 Drawing Sheets

METHOD OF PRETREATING THE DEPOSITION CHAMBER AND/OR THE SUBSTRATE FOR THE SELECTIVE DEPOSITION OF TUNGSTEN

The invention relates to a method enabling the selective deposition of tungsten ($WF_6$ reduced by $SiH_4$) to be improved.

DISCUSSION OF THE BACKGROUND

The selective chemical vapour deposition (CVD.) of tungsten is used for providing the interconnection of the metal layers during the manufacture of electronic circuits. The principle is as follows: the substrate to be treated includes a conducting layer, which is either a metal layer (tungsten, aluminium, titanium or their derivatives) or a silicon layer, covered with a silicon-oxide layer in which holes passing right through it are made at the desired locations. These holes are intended to be filled with tungsten, which thus makes it possible to provide the connection between conducting layers on either side of the silicon-oxide layer.

It is known that high deposition temperatures (between 330° and 400° C.) considerably improve the performance of the tungsten deposition, making it possible in particular to increase the adhesion (no disbonding, decreased contact resistance) and to decrease the stress (less than 1 gigapascal) and the resistivity of the tungsten deposited.

However, the main problem posed by the selective deposition of tungsten, and in particular at high temperatures, relates to the effective selectivity of the deposition. This is because, ideally, the tungsten should be deposited solely inside the holes made in the silicon oxide, in contact with the metal appearing at the bottom of these holes and not on the silicon-oxide layer itself. In practice, this result is very difficult to obtain, and this loss-of-selectivity problem increases as the deposition temperature increases. Generally it is considered impossible to carry out the selective vapour deposition of tungsten at temperatures above 300° C.; for example, K. Y. AHN et al., [Tungsten and other refractory metals for VLSI, Application IV MRS (1989)], have studied the growth of the selective tungsten deposition and have shown the loss of selectivity at temperatures above 300° C.

It would therefore be particularly desirable to manage to develop a method enabling tungsten to be deposited at high temperatures without a loss of selectivity resulting.

Various teams have studied the factors affecting the deposition of tungsten onto the silicon oxide, and the effects of various treatments on this deposition.

It is known (cf., for example, Application EP 0,430,303 in the name of APPLIED MATERIALS INC) to carry out, prior to the tungsten deposition, a cleaning pretreatment in order to descale the substrate, and to remove the moisture and the surface layers of oxides which interfere with the tungsten deposition; the nature of this treatment depends on that of the surface onto which it is desired subsequently to deposit tungsten selectively. For example, according to the Application EP 0,430,303, a treatment by a halogen-containing gas, such as $BCl_3$, for the aluminium and the aluminium oxides, a treatment by $NF_3$ or $SF_6$ for the silicon and its oxides and a treatment by hydrogen for the tungsten will preferably be chosen. The pretreatment is performed in a cleaning chamber and the substrate is subsequently transferred into a deposition chamber with a view to a selective deposition of tungsten.

KAJIYANA et al. [Mat. Res. Soc. Symp. Proc. VLSIV, p. 39 (1990)] describe the effect of a pretreatment, by a $CF_4 + CHF_3$ plasma followed by a $NF_3$ treatment, on the deposition of tungsten onto a silicon substrate. The purpose of this treatment is to prevent the formation of an irregular silicon-oxide layer at the surface of the substrate, since the presence of this layer subsequently produces irregularities in the deposition of tungsten. The $CF_4 + CHF_3$ plasma treatment has the effect of implanting a layer of carbon atoms at the surface of the silicon. These carbon atoms are subsequently themselves removed by sweeping the surface with a $NF_3$ plasma. The quality of the tungsten layer deposited onto a substrate thus treated has been determined by comparing a substrate carrying a native silicon-oxide layer with a substrate pretreated by immersion in a solution of hydrofluoric acid. This has made it possible to show that the removal of the oxide layer followed by a treatment by $NF_3$ enables the tungsten-deposition temperatures to be lowered; the film formed at 280° C. is similar, from its homogeneity and its regularity, to that obtained when tungsten is deposited at 300° C. after treatment of the substrate by immersion in hydrofluoric acid. The pretreatment described by KAJIYANA et al. therefore has the effect not of increasing the selectivity of the deposition at high temperature but of improving the characteristics of the deposition performed at low temperature.

TAMARU et al., [Dry Process Symposium, Electrochemical Society, Pennington N.J. (1990)] have studied the effect of various surface treatments on the selectivity of vapour deposition of tungsten onto the surface of the tungsten appearing at the bottom of holes made in a silicon-oxide layer. It emerges from this study that it is the $BCl_3$ pretreatment which enables the selectivity of the tungsten deposition to be increased most effectively. According to these authors, this treatment generates Si—Cl bonds as well as $SiCl_x$ and $SiCl_xO_y$ molecules which remain for a sufficient time at the surface of the silicon-oxide layer in order to protect it from being etched by tungsten hexafluoride molecules during the deposition of tungsten by CVD. These same authors also indicate that a $NF_3$ treatment does not enable a comparable selectivity to be obtained, this being due to the fact that the Si-F bonds provide only weak protection of the silicon oxide from being etched by the $WF_6$.

Now, the inventor has now developed a method enabling the selectivity of the vapour deposition of tungsten to be improved and excellent selectivity to be obtained at deposition temperatures above 300° C.

SUMMARY in fact, the inventor has found that a pretreatment of the deposition chamber by a plasma of a fluorine-containing gas, so as to allow traces of residual fluorine to remain in the said deposition chamber, prior to the selective deposition of tungsten, considerably improved the selectivity of the said deposition.

The subject of the present invention is a method of pretreating the deposition chamber intended to be used for the selective vapour deposition of tungsten, characterized in that a plasma of fluorine-containing gas, optionally combined with an inert diluting gas, is induced in the said deposition chamber.

According to a preferred embodiment of the method in accordance with the present invention, the deposition chamber is pretreated for 5 to 120 seconds by the fluorine-containing plasma at a pressure between 50 millitorr and 10 torr, an electrode power between 30 and 600 watts, a flow rate of fluorine-containing gas between 10 and 200 cm$^3$ min and a temperature identical to that at which the future deposition of tungsten will be performed, namely between 250° C. and 500° C.

According to a preferred arrangement of this embodiment, the deposition chamber is pretreated by the fluorine-containing plasma at a pressure between 150 millitorr and 1 torr and at a temperature between 300° C. and 400° C.

The method in accordance with the invention can be implemented with any type of deposition chamber using CVD; in the case where a deposition chamber is used which includes a substrate-holder device enabling the distance between the substrate and the plasma-generating electrode to be varied, the best results are obtained by maintaining an electrode/substrate-holder distance of between 12.5 and 22 mm.

For the implementation of the method in accordance with the present invention, the fluorine-containing gas used is chosen from the group formed by $NF_3$, $SF_6$, $CF_4$ and HF. The inert diluting gas may, for example, be helium, argon or nitrogen.

The pretreatment of the deposition chamber performed in accordance with the invention furthermore makes it possible to remove any trace of oxidizing residual gases prior to the selective deposition of tungsten.

The pretreatment of the deposition chamber by fluorine makes it possible to deposit tungsten selectively, at high temperatures, onto the conducting surfaces of a substrate composed of silicon oxide and of a conductor such as tungsten, aluminium, silicon, titanium, titanium nitride, titanium silicide, tungsten silicide, etc.

It is possible to carry out the pretreatment of the deposition chamber by fluorine prior to the introduction of the substrate: in this case, use will be made of a device enabling the substrate to be transferred from the cleaning chamber to the deposition chamber without exposure to the action of oxidizing gases. Preferably, the substrate will be subjected beforehand to a cleaning pretreatment appropriate to its nature, for example by $H_2$, $SF_6$, $BCl_3$, $NF_3$, and/or inert gases, in a controlled atmosphere, (for example under vacuum or in the presence of helium, argon or nitrogen). It is possible, for example, to use the device and the cleaning pretreatment which are described in the aforementioned Patent Application EP 0,430,303.

In a very advantageous variant, the substrate is introduced into the deposition chamber prior to the implementation of the method of pretreating the latter in accordance with the invention. The substrate and the deposition chamber are thus simultaneously pretreated: This furthermore makes it possible to prevent any contact of the substrate with air or with any other oxidizing gas following the fluorine treatment.

This variant of the invention is particularly advantageous in the case of a substrate composed of silicon oxide and of tungsten.

In fact, the inventor has discovered that, contrary to that which is suggested by the publication of TAMARU et al., mentioned hereinabove, a fluorine treatment of a silicon-oxide/tungsten substrate makes it possible to improve considerably the selectivity of the tungsten deposition performed subsequently.

However, the fluorine treatment of the substrate should be performed at appropriate doses; if a substrate whose surface is formed by two materials, namely silicon oxide and the tungsten (surface oxidized) appearing at the bottom of the holes etched in the silicon oxide, is considered, the fluorine dose suitable for enabling tungsten to be selectively deposited subsequently will be defined, on the one hand, by the minimum dose on the silicon oxide and, on the other hand, by the maximum dose on the tungsten.

These doses can be determined as follows:

On the silicon oxide, the treatment has to be sufficient to enable several atomic layers of fluorine to be deposited forming a uniform and impermeable barrier which blocks the nucleation of tungsten; there is no upper limit to the number of fluorine layers deposited;

On the other hand, on the substrate portion consisting of oxidized tungsten, there is no lower limit to the fluorine deposition, since the deposition of tungsten by CVD can be performed even in the absence of fluorine. An upper limit is achieved when the entire tungsten-oxide layer has been converted into tungsten fluoride. Any additional influx of fluorine etches the tungsten and forms, at the surface, an atomic layer of fluorine which prevents the subsequent deposition of tungsten by CVD.

The subject of the present invention is also a method of treating a substrate consisting of silicon oxide and of tungsten prior to the selective vapour deposition of tungsten, which method is implemented in a closed chamber, and in the absence of any trace of oxidizing gas which can interfere with the deposition of fluorine onto the substrate, and is characterized in that the said substrate is treated by a fluorine derivative at a suitable dose, the said dose being greater than or equal to the dose necessary to enable at least one atomic layer of fluorine to be deposited onto the silicon oxide, and being less than or equal to the dose necessary to convert the tungsten-oxide layer into tungsten fluoride.

In order to achieve the absence of any trace of oxidizing gas, the fluorine treatment of the substrate and, if necessary, its transfer into the deposition chamber, are performed in a controlled atmosphere, (for example under vacuum, or in the presence of helium, argon or nitrogen).

The person skilled in the art may easily determine the fluorine dose suitable for a defined silicon-oxide/tungsten substrate by carrying out a few tests and by measuring the quantity of fluorine absorbed on each of the constituents of the substrate. The inventor has thus carried out tests on several types of silicon oxide: P.TEOS (Plasma-deposited tetraethyl orthosilicate), USG (undoped silicate glass), BSG (borosilicate glass), PSG (phosphosilicate glass) and BPSG (borophosphosilicate glass). Among these various types of oxide, P.TEOS requires a higher fluorine dose than the other oxides tested.

According to a preferred embodiment of the present invention, the fluorine treatment of the substrate is carried out in a chamber supplied with $NF_3$, in which a plasma is generated by an electrode. Very advantageously, this chamber supplied with $NF_3$ is no different from the deposition chamber in which the selective deposition of tungsten will subsequently be performed. The pretreatment of the deposition chamber and the pretreatment of the substrate are thus carried out simultaneously.

The variation in the plasma time enables the fluorine dose to be kept constant at various treatment temperatures; by way of example, for a substrate consisting of a surface of P.TEOS and of tungsten, the plasma time varies from 5 seconds for a 290° C. treatment temperature, to 25 seconds for a 400° C. treatment temperature with a view to subsequent selective tungsten depositions at the same temperatures.

The method in accordance with the invention can be implemented in a deposition chamber which includes a substrate-carrying device enabling the distance between the substrate and the plasma-generating electrode to be varied; this variation in distance also makes it possible to influence the fluorine dose.

The electrode-substrate distance varies, for example between 22 mm for the deposition of the minimum fluorine dose and 12.5 mm for the deposition of the maximum fluorine dose.

According to a preferred arrangement of this embodiment, the fluorine treatment is performed for 5 to 25 seconds at a pressure between 150 and 300 millitorr, an electrode power between 20 and 30 watts, a temperature equal to that at which the deposition of tungsten will subsequently be carried out (that is to say between 250° and 500° C., preferably 300 ° to 400° C.), a $NF_3$ flow rate between 25 and 30 cm$^3$/min, in the presence of 50 cm$^3$/min of argon and of 50 cm$^3$/min of $N_2$, and an electrode-substrate distance between 12.5 and 22 mm.

Although is is particularly advantageous to carry out the fluorine pretreatment of the substrate composed of silicon oxide and of tungsten in the chamber which will subsequently serve for the selective tungsten deposition, the said substrate can also be separately pretreated and subsequently transferred into the deposition chamber, which may or may not itself be pretreated.

According to a preferred embodiment of the present invention, the fluorine treatment of the substrate is carried out in a conventional etching chamber of the RIE type by a $NF_3$ plasma. In this embodiment, for defined pressure, temperature, $NF_3$ flow rate and RF electrode power conditions, the desired fluorine dose is obtained by varying the exposure time of the substrate in the plasma; this dose may, in fact, vary according to the treatment which the oxide has previously undergone or because of its nature.

According to a preferred arrangement of this embodiment, the fluorine treatment is performed at a pressure between 200 and 500 millitorr, an electrode power between 20 and 30 watts, a temperature between 15 and 50° C., a $NF_3$ flow rate between 15 and 40 cm$^3$/min and a helium flow rate between 40 and 100 cm$^3$/min.

By way of example, for a substrate consisting of a surface of P.TEOS and of tungsten, at a pressure of 300 millitorr, an electrode power of 30 watts, a $NF_3$ flow rate of 20 cm$^3$/min and a helium flow rate of 50 cm$^3$/min, the plasma time varies between 15 seconds for the deposition of the minimum fluorine dose and 150 seconds for the deposition of the maximum fluorine dose.

According to yet another preferred embodiment of the present invention, the treatment of the substrate is carried out hot, under a sweep of xenon fluoride. The quantity of fluorine deposited is controlled by varying the time of exposure to $XeF_2$ and/or the treatment temperature.

After treatment according to one or other of the two embodiments explained hereinabove, the substrate is transferred into the deposition chamber under a controlled atmosphere in order to prevent any oxidation.

The selective vapour deposition of tungsten can be carried out in the deposition chamber and/or on the substrate which has undergone a pretreatment in accordance with the invention, according to any of the conventional protocols for the vapour deposition of tungsten ($WF_6$/$SiH_4$) known per se by the person skilled in the art; however, the pretreatment in accordance with the invention enables much higher temperatures to be used than those recommended in the prior art for selective deposition. The inventor has carried out various experiments for selective deposition of tungsten of thickness greater than 1 micron by operating at temperatures from 300° C. to 400° C. In all cases, a selective deposition of tungsten was obtained which, whilst preserving perfect selectivity, had all the advantages of deposition at these high temperatures, namely an improvement in the stress and in the adhesion of the deposited material, and a reduction in the interconnection resistance.

Because of these characteristics, the selective tungsten deposition carried out in accordance with the invention can be used in the manufacture of integrated circuits, thereby allowing metal interlayer connections of a diameter of less than 0.3 microns, whilst simplifying their production.

The present invention will be easier to understand with the rest of the description which follows, with reference to embodiment examples of the method in accordance with the invention.

However, it goes without saying that these examples are given solely by way of illustration of the subject of the invention, of which they in no way constitute a limitation.

EXAMPLE 1

EFFECT OF THE FLUORINE PRETREATMENT OF THE DEPOSITION CHAMBER ON THE CHARACTERISTICS OF THE SELECTIVE TUNGSTEN DEPOSITION.

This experiment was carried out in an APPLIED MATERIALS deposition chamber of the type of that described in Application EP 0,430,303.

in order to determine the optimum fluorine dose to be absorbed by the elements constituting the deposition chamber, 5 operating points linked to the variation in the pretreatment parameters have been defined as follows:

Pretreatment No. 1: no pretreatment;
Pretreatment No. 2: time=10 s; $NF_3$=30 cm$^3$ diluted in Ar=$N_2$=50 cm$^3$; pressure=300 millitorr; power of the electrode=30 watts.
Pretreatment No. 3; time=10 s; pure $NF_3$=150 cm$^3$; pressure=300 millitorr; power of the electrode=70 watts.

Pretreatment No. 4: time=30 s; pure $NF_3$=150 cm³; pressure=300 millitorr; power of the electrode=150 watts.

Pretreatment No. 5: time=60 s; pure $NF_3$=1500 cm₃; pressure=millitorr; power of the electrode=300 watts.

Pretreatment No. 6: time=120 s; pure $NF_3$=150 cm₃; pressure=300 millitorr; power of the electrode=300 watts.

After pretreatment, the substrate is placed in the deposition chamber and the deposition of tungsten is carried out at various temperatures, the other parameters of the deposition being identical to those described in the Application EP 0,430,303.

Figure 1:
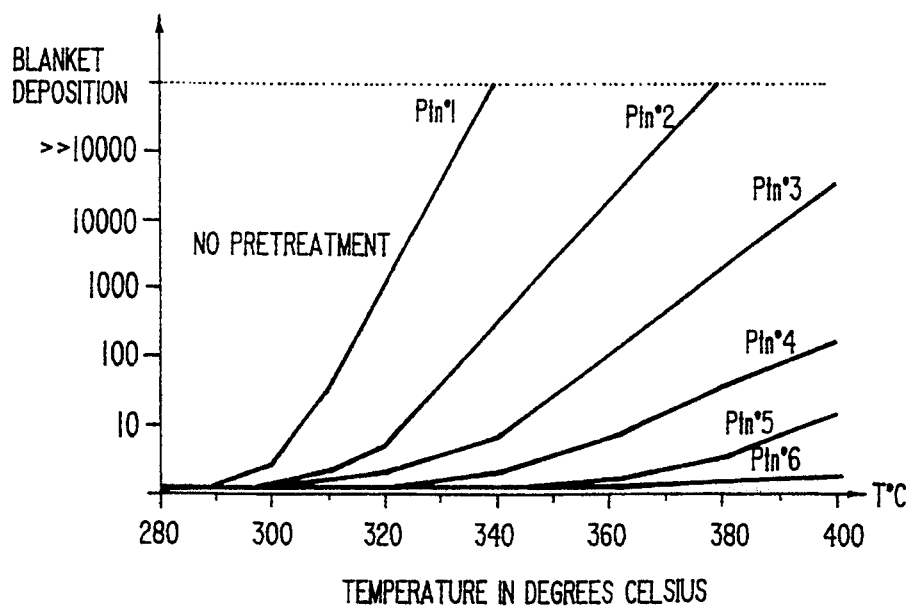
FIG. 1 shows the number of nuclei of $SiO_2$ as a function of deposition temperature.
Figure 2:
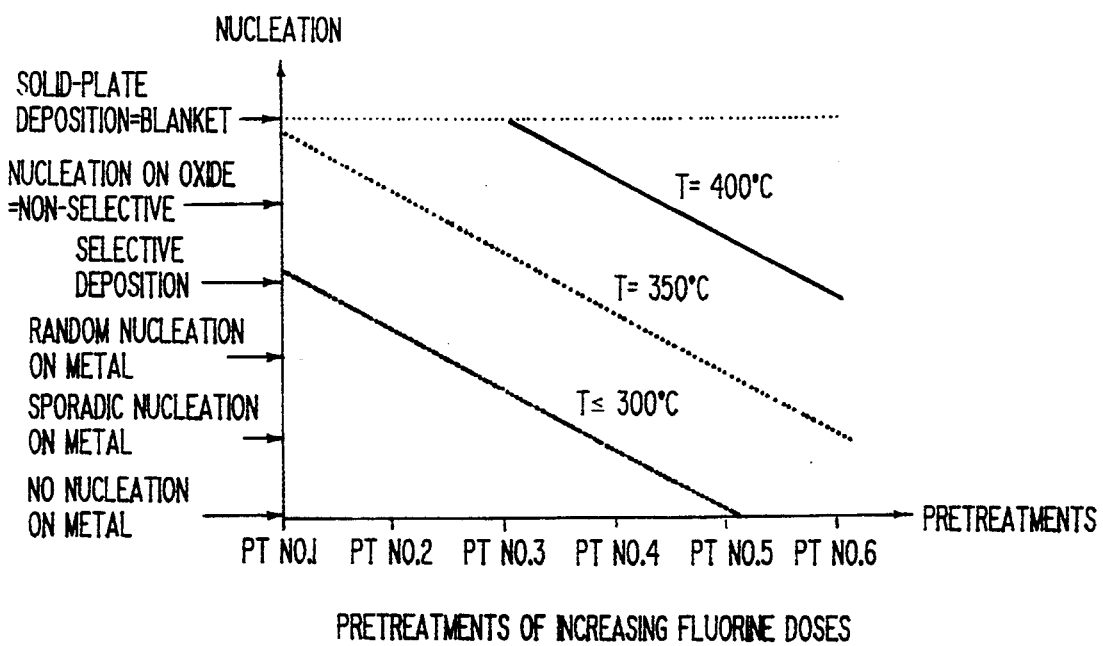
FIG. 2 shows the quality of nucleation of the deposit as a function of the fluorine gas dose.

In order to appreciate the effectiveness of these pretreatments, the 2 following methods have been used; the corresponding results are illustrated by FIGS. 1 and 2:

A) —FIG. 1 shows the number of nuclei on $SiO_2$ (image of the loss of selectivity) as a function of the deposition temperature for the various pretreatments of the deposition chamber representing the fluorine dose absorbed by the elements of the deposition chamber.

The selectivity is appreciated by counting tungsten particles on substrates comprising, at the surface, solely silicon oxide, carried out after pretreatment of the deposition chamber and deposition of tungsten.

By way of reference, a substrate is used which has been treated under the tungsten deposition conditions defined hereinabove, but in the absence of $WF_6$; knowing the number of particles on this reference substrate, the number of tungsten nuclei effectively deposited for each experiment is deduced therefrom, which enables the selectivity to be appreciated. The scale, referring to FIG. 1, is graduated in number of particles per cm²: for a number of less than 10 particles/cm² the deposition is called "selective" and for a number greater than 10,000 particles/cm² the deposition is called "solid plate".

B) —FIG. 2 shows the quality of nucleation of the deposition as a function of the fluorine dose induced in the deposition chamber, at various deposition T°C.'s.

The nucleation is appreciated by scanning electron microscope (SEM) observation of the selective tungsten deposition on a substrate which is formed, in this case, by batteries of holes of various diameters allowing a metal (tungsten) surface to appear through the silicon oxide.

The scale, referring to FIG. 2, is defined by the following points:

1) No deposition of tungsten on the metal support material="no nucleation";

2) Non-continuous deposition of tungsten on the large surfaces of the metal support material="sporadic nucleation";

3) Random deposition of tungsten in the small-diameter surfaces of the metal support material="poor nucleation".

4) Deposition of tungsten correctly filling all the various-diameter surfaces of the metal support material="selective";

5) Deposition of tungsten nucleating on the silicon oxide="non-selective".

EXAMPLE 2

PRETREATMENT OF A SILICON-OXIDE/TUNGSTEN SUBSTRATE: DETERMINATION OF THE QUANTITY OF FLUORINE DEPOSITED.

The substrate is deposited in an ALCATEL RIE-type etching chamber on the RF electrode.

The experimental conditions are as follows:
Pressure: 300 millitorr
Pressure of the plasma: 30 watts
Temperature: 40° C.
$NF_3$ flow rate: 20 cm³/min
(diluted in 50 cm³/min of He).

Under these conditions, the minimum dose is achieved for a time of 15 seconds of exposure of the substrate to the $NF_3$ plasma and the maximum dose by an exposure time of 150 seconds.

The quantity of fluorine absorbed is evaluated by AES analysis which measures the rate of desorption.

This analysis is carried out under the following conditions:
Irradiation: 6 µA,
e—Energy: 3 keV.

Figure 3:
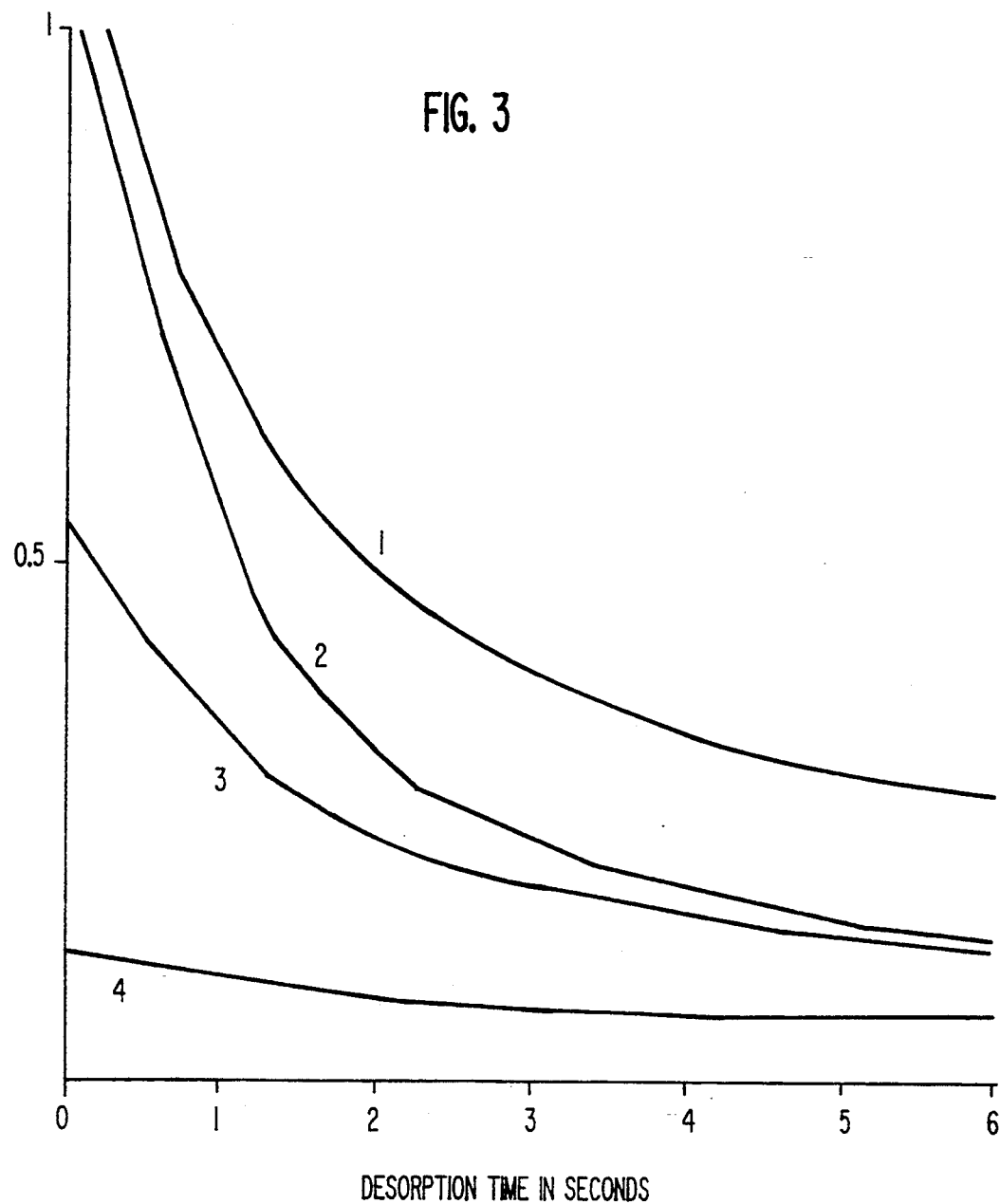
FIG. 3 shows the rate of desorption of F as evaluated by Atomic Emissions Spectroscopy (AES).

The beam of electrons scans a square of 200 µ side.
The results are illustrated in FIG. 3:
Curve 1: Substrate=$SiO_2$
Duration of the fluorine treatment: 150 s.
Curve 2: Substrate=tungsten
Duration of the fluorine treatment: 15 s.
Curve 3: Substrate=tungsten/$SiO_2$
Duration of the fluorine treatment: 150 s.
Curve 4: Substrate=tungsten
Duration of the fluorine treatment: 15 s.

These curves indicate that fluorine desorbs more slowly on specimens 1 and 3 than on specimens 2 and 4, showing that the absorbed fluorine dose is greater for a treatment of 150 seconds than for a treatment of 15 seconds. It is thus possible, for a given support material, to evaluate the absorbed fluorine dose as a function of the various treatment parameters and subsequently to adjust these parameters so as to deposit the necessary fluorine dose depending on the temperature at which it is desired to carry out the selective tungsten deposition.

EXAMPLE 3.

EFFECT OF THE FLUORINE PRETREATMENT OF THE SUBSTRATE AND OF THE DEPOSITION CHAMBER ON THE CHARACTERISTICS OF THE TUNGSTEN DEPOSITION

The fluorine pretreatment is carried out on the substrate placed inside the deposition chamber.

Fluorine pretreatment of the deposition chamber by a $NF_3$ plasma, the plasma being generated by an electrode and the substrate holder being independent of the said electrode.

The conditions of the pretreatment are those described in Example 1 for the pretreatment No. 2, namely: time=10 s; $NF_3$ =30 cm³ diluted in Ar=$N_2$=50 cm₃; pressure=300 millitorr; power of the electrode=30 watts; substrate-holder/electrode separation=22 mm.

The variation in the plasma time enables the fluorine dose to be kept constant, at various pretreatment and deposition temperatures; by way of example, for a substrate consisting of a surface of P.TEOS and of tungsten, the plasma time varies from 5 s for T=290° C. to 25 s for T=400° C.

The quality of the nucleation observed by SEM, (method B) described in Example 1), is practically constant and oscillates about the "selective deposition" defined point.

Figure 4:
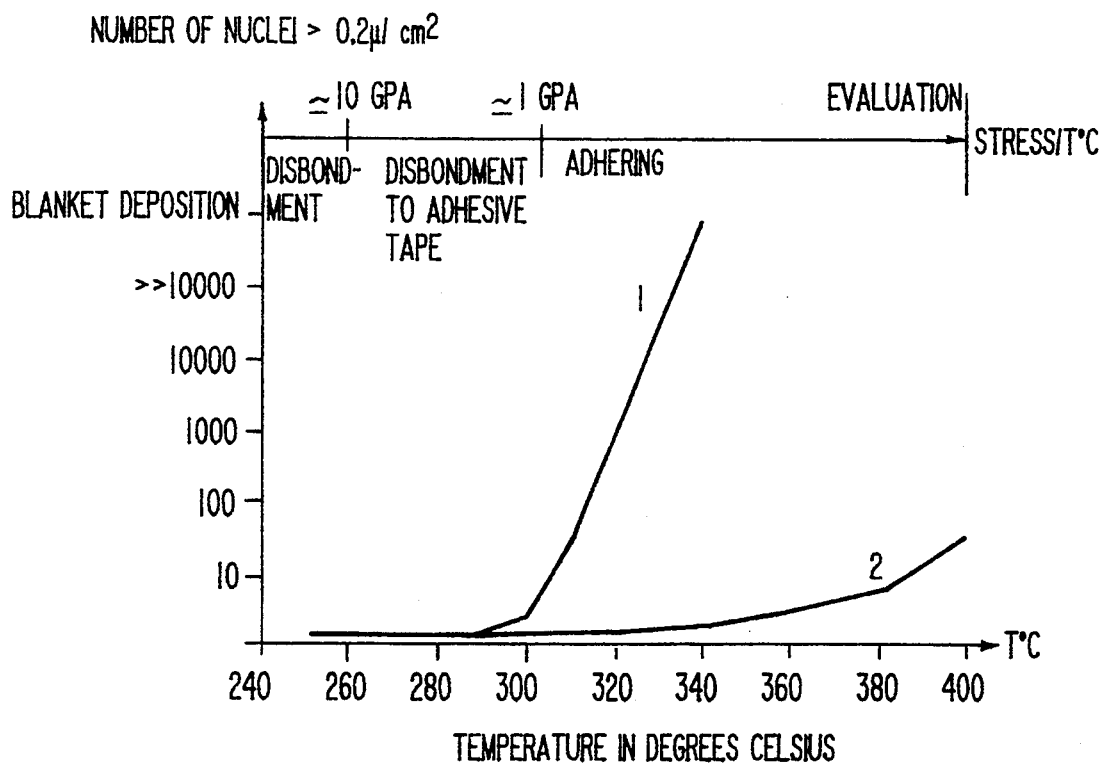
FIG. 4 represents the stress and selectivity as a function of temperature.

FIG. 4 represents, under the same selective tungsten deposition conditions (described in Example 1) the stress and the selectivity as a function of temperature.

The upper line of FIG. 4 represents the evaluation of the stress and of the strength of the selective tungsten material for deposition thicknesses of 7000 Å as a function of the deposition temperature.

For temperatures below 300° C., the stresses are greater than 1 GPa and the tungsten layer deposited disbonds very easily from the substrate (pull-off by an adhesive tape), and for deposition temperatures above 300° C., the deposition is no longer selective.

FIG. 4 also shows the loss of selectivity as a function of the temperature (measurement method A) described in Example 1) for a substrate consisting of a surface of P.TEOS and of tungsten: curve (1) for substrates and a chamber which has not undergone a fluorine pretreatment and curve (2) for substrates and a chamber which has undergone the pretreatment in accordance with the invention, which illustrates the effectiveness of the said pretreatment.

Figure 5:
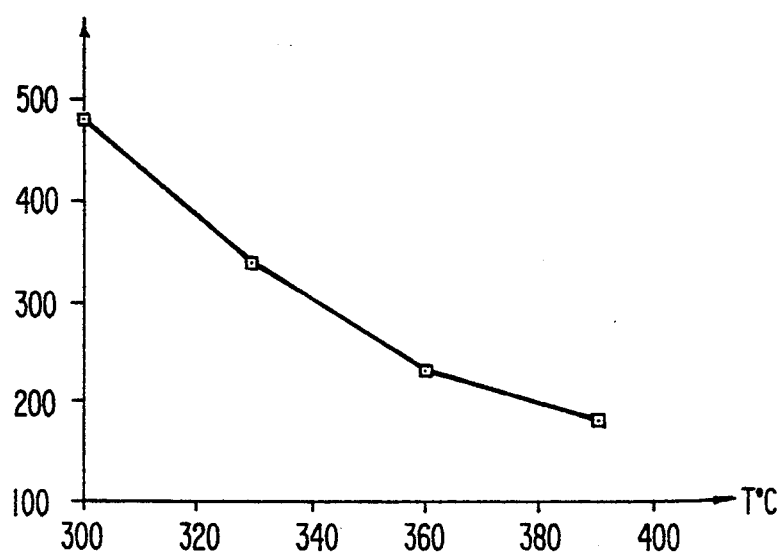
FIG. 5 shows the average resistance to the "vias" as a function of temperature of the tungsten deposition.

On the other hand, the curve of FIG. 5 shows the average resistance of the "vias" (junctions between layers provided by the holes filled with tungsten) of $\mu$m diameter, measured on circuit, as a function of the temperature of the selective tungsten deposition.

The average resistance is composed of the addition of the interface resistances between the selective tungsten and the metal layers, (solid-plate tungsten as the lower layer and Al/Si as the upper layer in this example), and the resistance of the selective tungsten which depends on the resistivity of the selective tungsten and on the dimensions of the via (diameter = 1 $\mu$m and filling thickness = 7000 Å).

Figure 6:
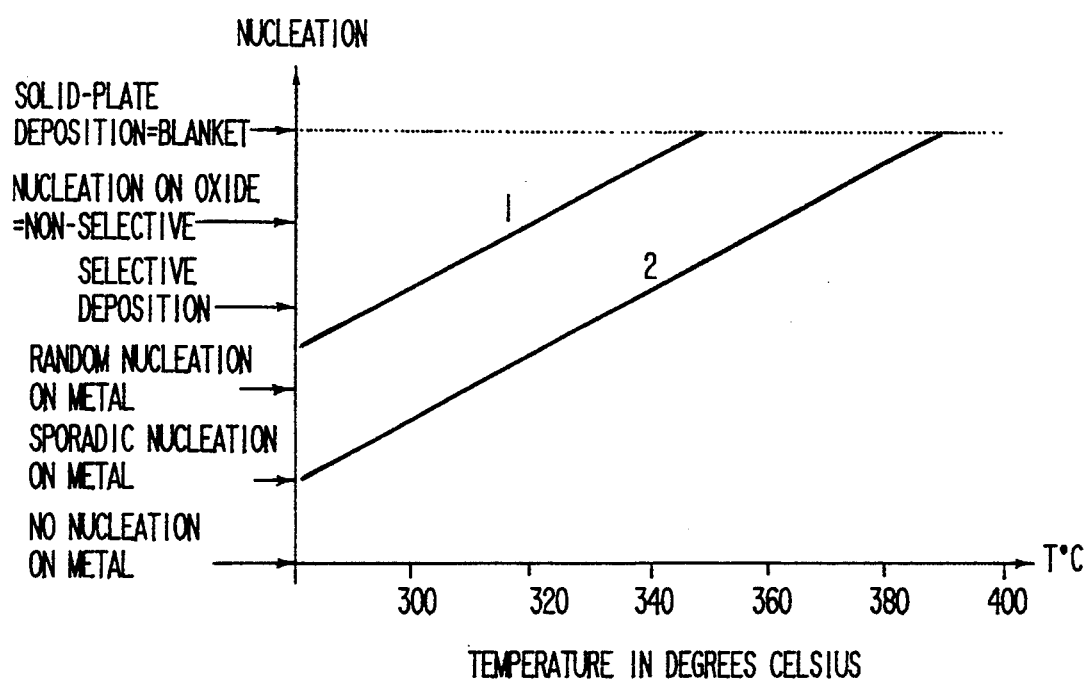
FIG. 6 represents the nucleation of the selective tungsten deposition on a pretreated substrate.

FIG. 6 represents the nucleation of the selective tungsten deposition on a pretreated substrate, as described in Example 2, and transferred, under a controlled atmosphere so as to prevent any oxidation, into a non-pretreated deposition chamber. Curve 1 corresponds to a pretreatment of the substrate to the minimum fluorine dose and curve 2 to a pretreatment of the substrate to the maximum fluorine dose.

As emerges from the above, the invention is not at all limited to those of its embodiments, of realization and of application, which have just been described in a more explicit manner; on the contrary, it embraces all the variants thereof which may occur to the specialist in the field, without departing from the framework nor the scope of the present invention.

I claim:

1. A method of pretreating for enhancing the selective deposition of tungsten, consisting essentially of the steps:
   (a) pretreating a deposition chamber with a plasma of a fluorine-containing gas such that traces of residual fluorine remain in said deposition chamber; and
   (b) depositing tungsten by chemical vapor deposition on a substrate in said deposition chamber with said traces of residual fluorine at a temperature of 250° C. or more.

2. The method of claim 1, wherein said pretreating is carried out at a temperature of 250°–500° C.

3. The method of claim 2, wherein said pretreating is carried out a temperature of 300°–400° C., and at a pressure of 150 millitorr to 1 torr.

4. The method of claim 2, wherein said pretreating is performed for 5–120 seconds, with a flow rate of said fluorine-containing gas of 10–200 cm$^3$/min.

5. The method of claim 1, wherein said substrate comprises silicon oxide and tungsten.

6. The method of claim 1, wherein said fluorine-containing gas is selected from the group consisting of $NF_3$, $SF_6$, $CF_4$ and HF.

7. The method of claim 1, wherein said pretreating is carried out after introducing said substrate into said deposition chamber.

8. The method of claim 1, wherein said pretreating is carried out before introducing of said substrate into said deposition chamber.

* * * * *